United States Patent [19]

Roche et al.

[11] Patent Number: 4,930,215
[45] Date of Patent: Jun. 5, 1990

[54] METHOD FOR THE FABRICATION OF A CONNECTION ZONE FOR A SYMMETRICAL STRIP LINE TYPE MICROWAVE CIRCUIT AND CIRCUIT OBTAINED THEREBY

[75] Inventors: Pascal Roche, Sartrouville; Yin H. Muoy, Montmorency, both of France

[73] Assignee: Thomson-CSF, Paris, France

[21] Appl. No.: 401,087

[22] Filed: Aug. 24, 1989

[30] Foreign Application Priority Data

Aug. 30, 1988 [FR] France ................................. 88 11356

[51] Int. Cl.$^5$ ............................................... H05K 3/36
[52] U.S. Cl. ...................................... 29/830; 333/116; 333/238
[58] Field of Search .................. 29/830; 333/116, 238; 174/68.5

[56] References Cited

U.S. PATENT DOCUMENTS

| | | | |
|---|---|---|---|
| 3,398,232 | 8/1968 | Hoffman | 333/238 |
| 4,159,507 | 6/1979 | Alfaro | 333/238 X |
| 4,250,616 | 2/1981 | Klimek et al. | 29/830 |
| 4,609,892 | 9/1986 | Higgins, Jr. | 333/238 X |
| 4,821,001 | 4/1989 | Fields et al. | 29/830 X |
| 4,862,120 | 8/1989 | Ruxton et al. | 333/238 X |

Primary Examiner—Carl J. Arbes
Attorney, Agent, or Firm—Roland Plottel

[57] ABSTRACT

A symmetrical strip line type microwave circuit, the input-output connection zones of which are made in the following way:

a groove is made in that of the insulating substrates which does not bear the central conductor of the symmetrical strip line circuit, along the contour of the desired connection zone;

the two substrates are bonded together;

the exterior of the structure is protected by electrolytic deposition of a tin-lead alloy;

a counter-groove is made in the first substrate along the contour of the connection zone, and that portion of the substrate located inside the zone is eliminated.

4 Claims, 3 Drawing Sheets

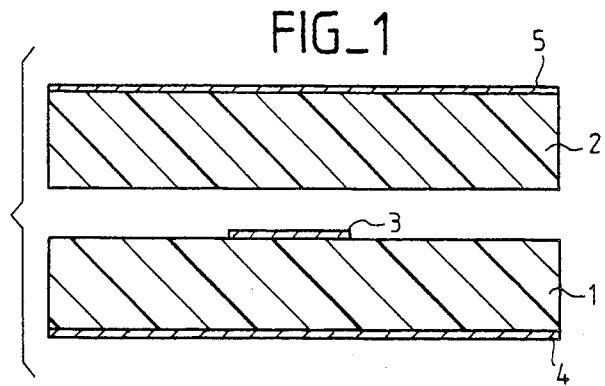
FIG_1
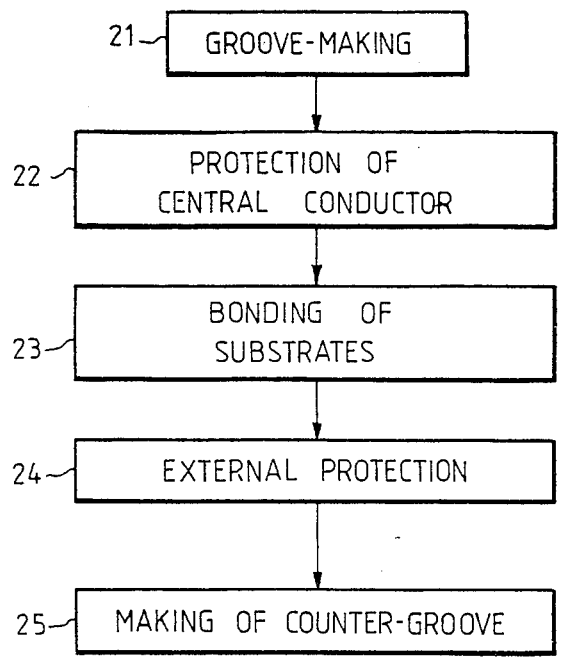
FIG_2

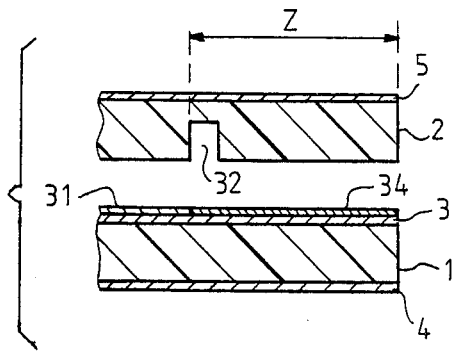
FIG_3-a
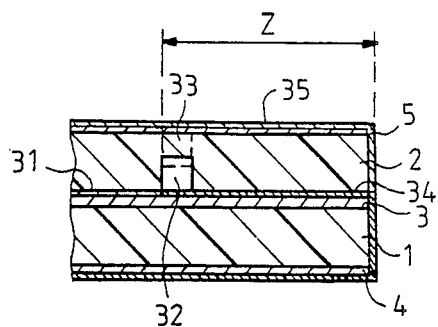
FIG_3-b
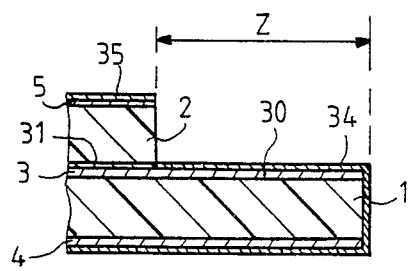
FIG_3-c

FIG_4-a
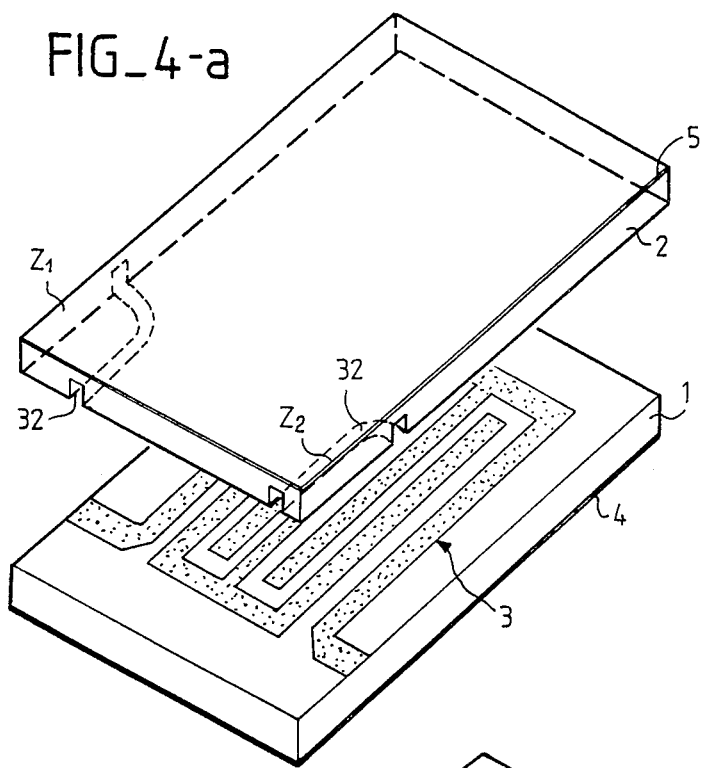
FIG_4-b
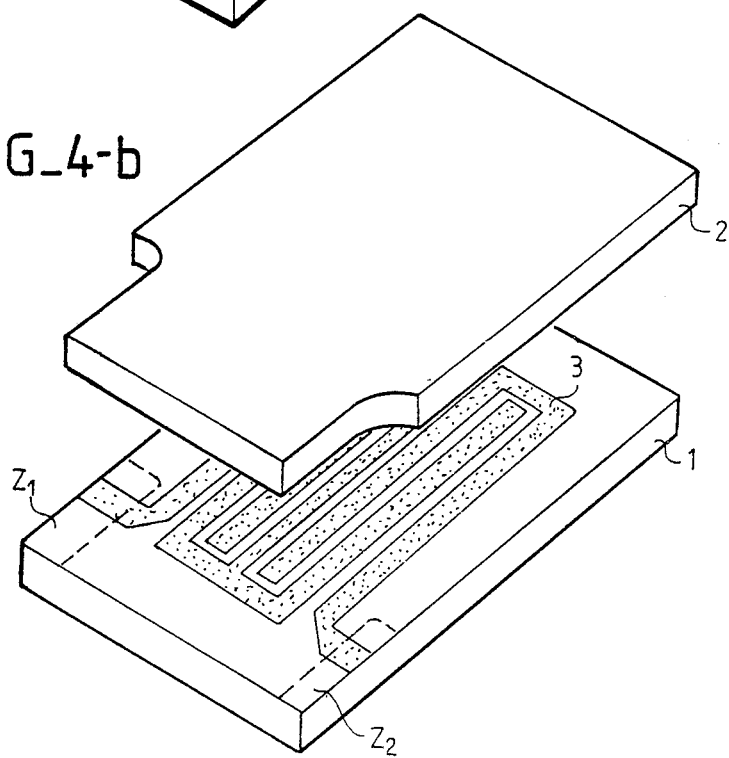

METHOD FOR THE FABRICATION OF A CONNECTION ZONE FOR A SYMMETRICAL STRIP LINE TYPE MICROWAVE CIRCUIT AND CIRCUIT OBTAINED THEREBY

BACKGROUND OF THE INVENTION

1. Field of the Invention

The present invention relates to the field of symmetrical strip line type microwave circuits made with multilayer printed circuit techniques.

More particularly, an object of the present invention is an input-output connection zone for a circuit such as this.

2. Description of the Prior Art

The invention thus concerns a symmetrical strip line type microwave circuit, made by techniques employed in the multilayer printed circuit industry. In other words, this circuit, as shown in an exploded, sectional view in FIG. 1, comprises:

a first, insulating substrate 1, one face of which bears a conductive layer 4 forming a ground plane, while the other face bears a conductive pattern 3 forming the central conductor of the symmetrical strip line circuit;

a second, insulating substrate 2, with one of its faces designed to be placed on the central conductor 3; the other face of the substrate 2 bears a conductive deposit 5 forming a second ground plane.

It would thus seem that the central conductor 3 is sandwiched between the two insulating substrates 1 and 2.

To connect a circuit such as this to the components of the adjacent circuits, it is necessary to make a connection zone where the central conductor 3 will be accessible, that is, it will be necessary to expose the central conductor to the open.

To this effect, there is the following prior art procedure: the pattern designed to form the central conductor is deposited on the substrate 1, the other face of which is metallized. Before bonding the second substrate 2 to the first one, a scallop is made in the substrate 2. The geometry of this scallop is such that a portion of the central conductor 3 is exposed to the open and it is possible to fix a connection thereto. However, this method has drawbacks. For, it is necessary to have a protective film, generally of the varnish type, deposited by brush, on the zones thus designed to be exposed to the open, so that they are not damaged during the subsequent steps of the fabrication. At the end of fabrication, this varnish should, of course, be removed by means of solvents. This implies additional operations which should be performed with great precision and are, furthermore, difficult to automate and are, therefore, expensive.

SUMMARY OF THE INVENTION

An object of the present invention is a microwave circuit, the input-output connection zones of which are made in the following way:

a groove is made on the above-mentioned second substrate, along the contour of the zone to be exposed to the open;

at the same time, the central conductor deposited on the first substrate is preferably protected by means of a conductive deposit which is, preferably, a tin-lead alloy;

the two substrates are bonded;

a protective layer for the exterior of the circuit, a tin-lead alloy for example, is deposited;

a counter-groove is made, i.e. a groove is made in the second substrate along the same contour as above but on the opposite face, so as to completely eliminate the material forming the substrate along this contour, and that part of the substrate located inside the contour is removed.

BRIEF DESCRIPTION OF THE DRAWINGS

Other objects, special features and results of the invention will emerge from the following description, given as a non-restrictive example and illustrated by the appended drawings, of which:

FIG. 1, already described, is a sectional drawing of a symmetrical strip line type circuit according to the prior art;

FIG. 2 is a diagram illustrating the progress of the method according to the invention;

FIGS. 3a, 3b and 3c, are sectional drawings of a symmetrical strip line circuit obtained by the method according to the invention, during the different steps of its fabrication;

FIGS. 4a and 4b show an example of a symmetrical strip line circuit obtained by the method according to the invention, during the different steps of its fabrication.

In these different figures, firstly the same references are repeated for the same elements and, secondly, for the clarity of the drawing, true scale has not been maintained.

DESCRIPTION OF PREFERRED EMBODIMENTS

FIG. 2 is a diagram illustrating the progress of the different steps of the method according to the invention. It shall be described hereinafter with reference to FIGS. 3a, 3b and 3c, which represent sectional views of a symmetrical strip line obtained by the method according to the invention, during different steps of its fabrication.

Firstly, during preliminary steps not shown in the figures, two insulating substrates are made in a standard way. These are the substrates 1 and 2 of FIG. 1, in the form of small plates. On one of the faces of each of these substrates 1 and 2, there is deposited a conductive layer which is generally metallic, for example made of copper, designed to form the ground planes 4 and 5 of the symmetrical strip line circuit.

Furthermore, a conductive pattern designed to form the central conductor 3 of the symmetrical strip line circuit is deposited on the second face of the substrate 1. It is generally metallic: for example it is also made of copper.

The first step which is specific to the method according to the invention, is a groove-making step (21, FIG. 2). This step consists in making a groove, marked 32 in FIG. 3a, in that face of the substrate 2 which is not metallized, along a pre-defined contour which is the contour of the zone (Z, FIGS. 3) wherein it is desired to expose the central conductor of the symmetrical strip line to the open, for the subsequent input-output connections of the circuit.

The next step (22, FIG. 2) consists in setting up the anti-corrosion protection of the central conductor 3 in the zone Z, where it will be exposed to the open. This protection is preferably achieved by electrolytic deposition of a layer of a tin-lead alloy.

This embodiment has the advantage of improving the quality and the reliability of the brazing which will be subsequently done on the central conductor 3 for the input-output connections.

This protective layer is represented in FIG. 3a by a layer 34, deposited on the central conductor 3, solely on the zone Z.

In one variant, which is not shown, the protective layer 34 may be deposited on the entire central conductor.

It must be noted that this protection step can occur at another time in the fabrication method, for example at the end of the method.

The next step (23, FIG. 2) consists in the deposition of a layer of bonder (31, FIG. 3a) on the central conductor 3, except in the connection zone Z and, then, in bonding the two substrates so that the two ground planes 4 and 5 are located on the exterior of the resultant structure.

The bonder is deposited preferably in the form of a thin film wherein an aperture, corresponding to the zone Z, is made. This thin film is placed on one of the substrates.

The next step (24, FIG. 2) consists in the deposition of a anti-corrosion protection layer (35, FIG. 3b) on the entire structure thus formed, hence on the ground planes 4 and 5, and the edges of the substrates 1 and 2. This protection is preferably achieved by electrolytic deposition of a so-called bright and non-remelted lead-tin alloy: for, this material has the advantage, over other alloys, of being hardly oxidizable, without any remelting operation being necessary.

A mode of protection such as this ensures the shielding of the circuit and has various advantages. Firstly, the protective layer can be deposited simply and inexpensively on the entire external surface of the structure. Then, as it does not necessitate any remelting step, which is usually done in the region of 200° C., it prevents the circuit from having to undergo any thermal shock and, consequently, from the possible loosening of the metallizations, which are hard to detect and lead to the rejection of the circuit during subsequent post-assembly testing operations.

The next step (25, FIG. 2) consists in making a counter-groove, marked 33 and shown in dashes in FIG. 3b, in the substrate 2 wherein the groove 32 had been made, along the same contour, namely that of the zone Z, but on the other face, namely the one bearing the ground plane 5. The height of the counter-groove 33 is such that it completely eliminates the material of the substrate 2 and enables the groove 32 to come out into the open. That part of the substrate 2 located in the zone Z, which is not bonded, is then removed.

The groove making and counter-groove making operations are preferably done by means of digital control machines, enabling precision, repetitivity and lower costs.

The advantage of first making a groove and then a counter-groove is that it enables greater tolerance on the height of the counter-groove. In effect, if a single groove were to be made, its height would have to be very precisely determined in order to eliminate the entire substrate 2 and nothing but this substrate, without touching the layers 34 and 3.

It is thus seen that a symmetrical strip line circuit is obtained, on the exterior of which a protective layer has been made, having a zone (Z) in which the central conductor is exposed to the open, without its being necessary to provide for a step for the protection of this zone during fabrication, the substrate 2 itself giving the requisite protection.

Should it be the case, as often happens in practice, that the substrates 1 and 2 form part of bigger small plates, generally with standardized format, a clipping operation (not shown) is performed at the end of the method. This is an operation during which the useful parts of the substrate 1 and 2 are separated from the rest of the small plates.

FIGS. 4a and 4b show a particular example of a symmetrical strip line circuit obtained by the method according to the invention, during the different stages of its fabrication.

These figures again show the substrates 1 and 2, with their ground planes, 4 and 5 respectively, as well as the substrate 1 bearing the conductive pattern 3, for example constituting a filter in the form of interdigitated combs. For the clarity of the figure, the surface of the conductor 3 has been dotted. The substrates 1 and 2 are made of PTFE for example.

FIG. 4a shows two grooves 32 made in the face of the substrate 2 designed to come against the conductor 3. These two grooves 32 respectively surround two zones $Z_1$ and $Z_2$ wherein the central conductor 3 will be exposed to the open.

FIG. 4b shows the same circuit in an exploded view at the end of the operations, i.e. when the pieces of substrate 2, corresponding to the zones $Z_1$ and $Z_2$, have been removed, thus revealing the conductor 3.

What is claimed is

1. A method for the fabrication of a connection zone for a symmetrical strip line type circuit, comprising:
    a first step for the deposition of a first conductive layer on a first face of a first substrate, forming a first ground plane of the symmetrical strip line circuit;
    a second step for the deposition of a second conductive layer on a first face of a second substrate, forming a second ground plane of the symmetrical strip line circuit;
    a third step for the deposition of a conductive pattern on the second face of the first substrate, forming the central conductor of the symmetrical strip line circuit;
    a fourth step for the making of a groove on the second face of the second substrate, along the contour of said connection zone;
    a fifth step for the bonding of the second face of the first substrate to the second face of the second substrate;
    a sixth step for the deposition of a layer for the protection of the external surfaces of the circuit;
    a seventh step for the making of a counter-groove on the first face of the second substrate along said contour, so as to completely eliminate the material forming the second substrate along this contour, and elimination of that part of the second substrate located inside the contour.

2. A method according to claim 1, further comprising, between the fourth and fifth steps, a further step for the deposition of a material comprising a tin-lead alloy on the central conductor.

3. A method according to claim 1, wherein the sixth step consists in an electrolytic deposition of a material, comprising a tin-lead alloy, on all the external surfaces of said circuit.

4. A method according to claim 3, wherein the electrolytically deposited material is non-remelted, bright, tin-lead alloy.

* * * * *